United States Patent
Lutgen

(10) Patent No.: US 7,792,174 B2
(45) Date of Patent: Sep. 7, 2010

(54) SURFACE-EMITTING SEMICONDUCTOR LASER COMPONENT AND OPTICAL PROJECTION APPARATUS WITH A SURFACE-EMITTING SEMICONDUCTOR LASER COMPONENT SUCH AS THIS

(75) Inventor: Stephan Lutgen, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/541,077

(22) Filed: Sep. 28, 2006

(65) Prior Publication Data

US 2007/0091964 A1    Apr. 26, 2007

(30) Foreign Application Priority Data

Sep. 30, 2005  (DE) .................. 10 2005 047 150
Dec. 6, 2005   (DE) .................. 10 2005 058 237

(51) Int. Cl.
*H01S 5/00* (2006.01)
(52) U.S. Cl. .................................... 372/50.124
(58) Field of Classification Search ............. 372/50.124
See application file for complete search history.

(56) References Cited

U.S. PATENT DOCUMENTS

| | | | | |
|---|---|---|---|---|
| 5,949,804 A * | 9/1999 | Okazaki | ................ | 372/32 |
| 5,991,318 A * | 11/1999 | Caprara et al. | ................ | 372/22 |
| 6,396,864 B1 * | 5/2002 | O'Brien et al. | ................ | 372/49.01 |
| 6,636,539 B2 | 10/2003 | Martinsen | | |
| 6,717,964 B2 * | 4/2004 | Jiang et al. | ................ | 372/20 |
| 6,763,047 B2 * | 7/2004 | Daiber et al. | ................ | 372/34 |
| 7,065,109 B2 * | 6/2006 | Bacher et al. | ................ | 372/21 |
| 2002/0182779 A1 | 12/2002 | Bewley et al. | | |
| 2003/0012250 A1 * | 1/2003 | Shirasaki | ................ | 372/98 |
| 2003/0048422 A1 | 3/2003 | Lowenthal et al. | | |
| 2004/0202223 A1 | 10/2004 | Crosson et al. | | |
| 2005/0036528 A1 | 2/2005 | Schmid | | |
| 2005/0226304 A1 | 10/2005 | Schwarz et al. | | |

FOREIGN PATENT DOCUMENTS

| | | |
|---|---|---|
| DE | 10 2004 011 456 A1 | 8/2005 |
| EP | 1 560 306 A | 8/2005 |
| GB | 2 399 942 A | 9/2004 |

OTHER PUBLICATIONS

J. Hastie et al., "0.5-W Single Transverse-Mode Operation of an 850-nm Diode-Pumped Surface-Emitting Semiconductor Laser", IEEE Photonics Technology Letters, IEEE Service Center, vol. 15, No. 7, pp. 894-896, Jul. 2003.

(Continued)

*Primary Examiner*—Minsun Harvey
*Assistant Examiner*—Patrick Stafford
(74) *Attorney, Agent, or Firm*—Cohen Pontani Lieberman & Pavane LLP

(57) ABSTRACT

A surface-emitting semiconductor laser component is disclosed, having a resonator (3, 9), a semiconductor body (5) which comprises a layer sequence (4) which is intended for radiation production, a transparent, frequency-selective thermally conductive element (6) which makes thermal contact with a surface (5a) of the semiconductor body (5) through which radiation passes, and an optical bandpass filter (8) which is suitable for suppression of predeterminable resonator modes.

16 Claims, 2 Drawing Sheets

OTHER PUBLICATIONS

U. Steegmüller et al., "High Speed Green Frequency Converted Semiconductor Laser for Projection Displays", Digest of Technical Papers—SID International Symposium, vol. 36, No. 2, pp. 1608-1609, May 25, 2005.

H. Linberg et al., "Single-frequency operation of a high-power, long-wavelength semiconductor disk laser", Optics Letters Opt. Soc. of America, vol. 30, No. 17, pp. 2260-2262, Sep. 1, 2005.

W.J. Alford et al., "High power and good beam quality at 980 nm from a vertical external-cavity surface-emitting laser", Journal of the Optical Society of America, vol. 19, No. 4, pp. 663-666, Apr. 1, 2002.

A. Härkönen et al., "4 W single-transverse mode VECSEL utilizing intra-cavity diamond heat spreader", Electronics Letters, vol. 42, No. 12, pp. 693-694, Jun. 8, 2006.

H. Lindberg et al., "Improved spectral properties of an optically pumped semiconductor disk laser using a thin diamond heat spreader as an intracavity filler", IEEE Photonics Technology Letters, vol. 17, Jul. 2005, pp. 1363-1365.

H. Lindberg et al., "A high power, single frequency, 1550nm, semiconductor disk laser", Conference Proceedings CLEO Europe, 2005.

* cited by examiner

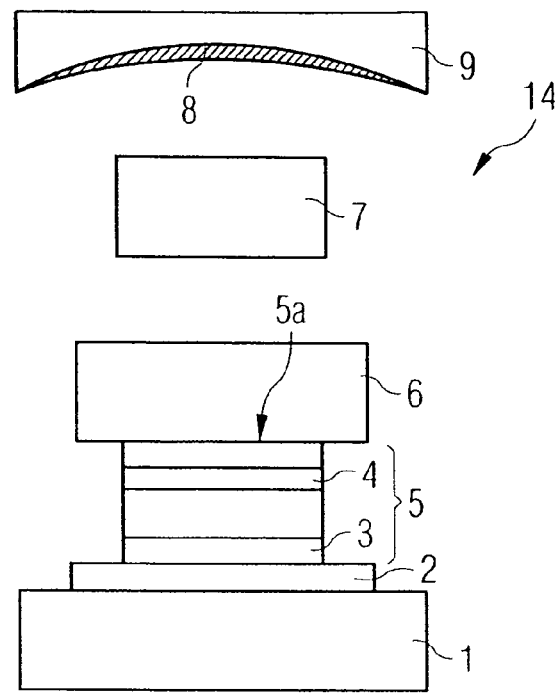
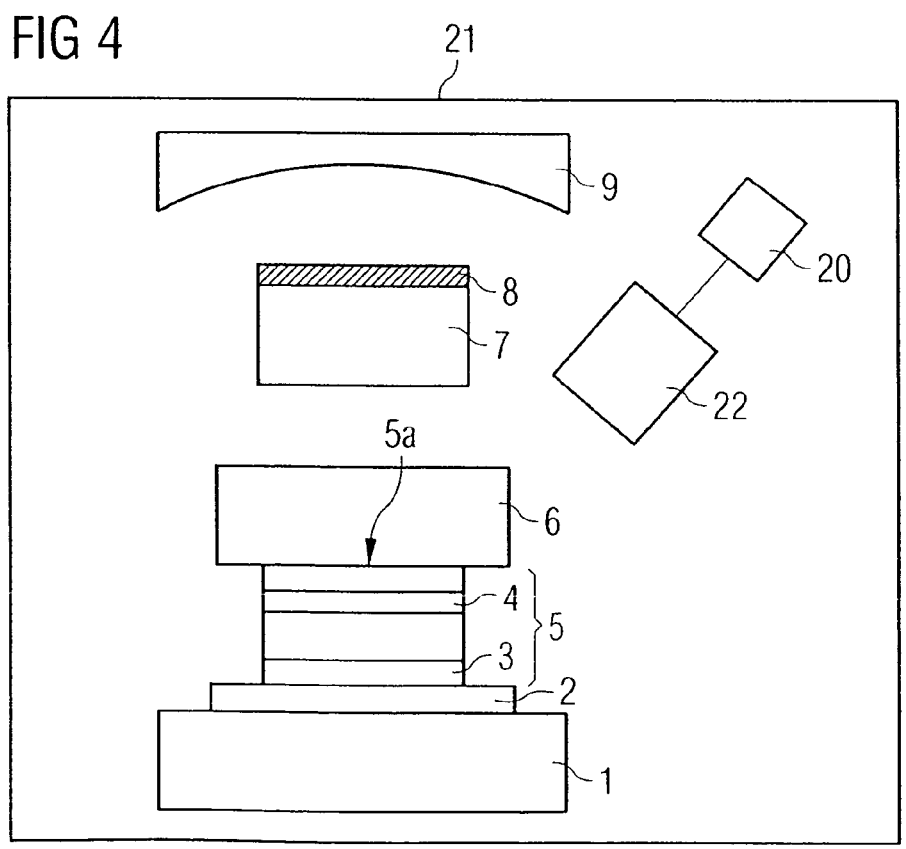

SURFACE-EMITTING SEMICONDUCTOR LASER COMPONENT AND OPTICAL PROJECTION APPARATUS WITH A SURFACE-EMITTING SEMICONDUCTOR LASER COMPONENT SUCH AS THIS

RELATED APPLICATIONS

This patent application claims the priorities of German patent applications 102005047150.1 filed Sep. 20, 2005 and 102005058237.0 filed Dec. 6, 2005, the disclosure content of which is hereby incorporated by reference.

FIELD OF THE INVENTION

A surface-emitting semiconductor laser component is specified. Furthermore, an optical projection apparatus is specified, having a surface-emitting semiconductor laser component such as this.

SUMMARY OF THE INVENTION

One object of the invention is to provide a surface-emitting semiconductor laser component whose laser emission is particularly stable over time.

This and other objects are attained in accordance with one aspect of the present invention directed to a surface-emitting semiconductor laser component, comprising: a resonator; a semiconductor body which comprises a layer sequence which is intended for radiation production; a transparent, frequency-selective thermally conductive element in thermal contact with a surface of the semiconductor body through which radiation passes; and an optical bandpass filter which is suitable for suppression of predeterminable resonator modes.

A surface-emitting semiconductor laser component is specified. According to at least one embodiment of the surface-emitting semiconductor laser component, the component comprises a semiconductor body with a semiconductor layer sequence. The semiconductor layer sequence comprises, inter alia, a layer sequence which is suitable for radiation production, and may include, for example, a pn-junction, a single quantum-well structure and a multiple quantum-well structure.

The semiconductor body furthermore preferably has a reflective layer or layer sequence which is suitable for reflection of at least a portion of the electromagnetic radiation which is produced in the layer sequence that is intended for radiation production. The reflective layer sequence for this purpose comprises, for example, a Bragg mirror. Electromagnetic radiation which is produced in the radiation-producing layer sequence during operation of the semiconductor laser preferably emerges from the semiconductor body through a surface through which radiation passes. The surface through which radiation passes is in this case formed by one main surface of the semiconductor body, which is arranged on a side of the radiation-producing layer sequence facing away from the reflective layer sequence.

The surface-emitting semiconductor laser component preferably has a further mirror which, for example, is arranged externally, that is to say remotely from the semiconductor body. The external mirror and the reflective layer sequence in the semiconductor body form a resonator for the semiconductor laser component, in which electromagnetic radiation which has been amplified in the radiation-producing layer sequence can circulate.

According to at least one embodiment, the surface-emitting semiconductor laser component has a thermally conductive element which makes thermal contact with the surface of the semiconductor body through which radiation passes. The thermally conductive element is thus arranged in the resonator (which is formed by the reflective layer sequence and the external mirror) in the surface-emitting semiconductor laser component. The thermally conductive element in this case represents a heat spreader which absorbs heat that is produced during operation of the semiconductor laser component, and emits it to the surrounding area. The thermally conductive element is permeable for at least a portion of the laser radiation circulating in the resonator. This means that the thermally conductive element is preferably partially transparent, at least in the frequency range of electromagnetic radiation produced in the radiation-producing layer sequence.

Furthermore, the thermally conductive element preferably has frequency-selective characteristics. For this purpose, the thermally conductive element is, for example, an etalon. A plurality of longitudinal modes can be stimulated in the resonator on the basis of the etalon effect in the thermally conductive element that is arranged in the resonator, whose mode separation is then dependent on the thickness of the thermally conductive element. Owing to the frequency-selective characteristics of the thermally conductive element, this results in preferably spectrally narrowband modes of the laser radiation circulating in the resonator. In this case, the thermally conductive element preferably does not completely fill the resonator.

According to at least one embodiment, the surface-emitting semiconductor laser component furthermore has an optical bandpass filter, which is arranged in the resonator in the semiconductor laser component, or is an integral component of the resonator. The optical bandpass filter is suitable for suppression of predeterminable resonator modes. For this purpose, by way of example, the bandpass filter is designed to be permeable or reflective for electromagnetic radiation in a specific frequency range. Only those resonator modes whose frequencies are in this frequency range can then be excited in the resonator. This means that the pass band of the optical bandpass filter is chosen such that only specific resonator modes can be excited. The pass band is preferably chosen such that one and only one resonator mode can be excited, for example the transversal fundamental mode $TEM_{00}$.

The surface-emitting semiconductor laser component is in this case based, inter alia, on the idea that a frequency-selective optical element in the resonator—such as an etalon—can be used as a thermally conductive element or as a heat spreader and thus also has a positive influence on the thermal behavior of the component, in addition to its optical characteristics. Furthermore, the frequency-selective thermally conductive element makes it possible to excite spectrally particularly narrowband transversal modes in the laser resonator, which are separated from one another. By way of example, a relatively broadband bandpass filter can then be used to select one of these modes, that is to say to suppress the remaining modes. A broadband bandpass filter such as this can be produced particularly easily, and thus particularly cost-effectively.

According to at least one embodiment, the thermally conductive element contains or comprises one of the following materials: diamond, silicon carbide (SiC). In this case, the thermally conductive element preferably has a thickness in the direction of the electromagnetic radiation emerging from the semiconductor body of 20 μm to 70 μm, preferably 30 μm to 60 μm. The thermally conductive element is preferably in the form of diamond etalon or silicon-carbide etalon. This means that it can be made to be appropriately reflective.

According to at least one embodiment of the surface-emitting semiconductor laser component, an optically non-linear crystal is also arranged in the resonator in the semiconductor laser component.

The optically non-linear crystal is preferably provided for frequency conversion of at least a portion of the laser radiation circulating in the resonator.

According to at least one embodiment of the laser apparatus, the optically non-linear crystal is composed of at least one of the following crystals: lithium triborate, for example $LiB_3O_5$ (LBO), bismuth triborate, for example $BiB_3O_6$ (BiBO), potassium titanyl phosphate $KTiOPO_4$ (KTP), magnesium-oxide-doped congruent lithium niobate, for example $MgO:LiNbO_3$ (MgO:LN), magnesium-oxide-doped stoichiometric lithium niobate, for example $MgO:s-LiNbO_3$ (MgO:SLN), magnesium-oxide-doped stoichiometric lithium tantalate, for example $MgO:LiTaO_3$ (MgO:SLT), stoichiometric $LiNbO_3$ (SLN), stoichiometric $LiTaO_3$ (SLT), RTP ($RbTiOPO_4$), KTA ($KTiOAsO_4$), RTA ($RbTiOAsO_4$), CTA ($CsTiOAsO_4$).

The optically non-linear crystal is preferably suitable for doubling the frequency of the radiation passing through it.

Apart from the crystals mentioned here for frequency conversion, it is, however, also possible to arrange other crystals or materials which are suitable for frequency conversion alternatively or additionally in the resonator for the laser.

The surface-emitting semiconductor laser component described here thus makes use, inter alia, of the idea that the interaction of frequency-selective thermally conductive element and an optical bandpass filter allows stable single-mode operation of the surface-emitting semiconductor laser component. The laser radiation produced in this way can then be subjected to frequency conversion with particularly high efficiency by the optically non-linear crystal. In particular, the frequency-selective thermally conductive element and the optical bandpass filter suppress mode hopping.

According to at least one embodiment of the surface-emitting semiconductor laser component, the bandpass filter is in the form of a coating. The bandpass filter is, for example, applied as a coating to an element arranged in the resonator—such as the non-linear optical crystal. The coating may in this case be in the form of an antireflective coating.

Furthermore, it is possible for the coating to be applied to one surface of the external mirror. The bandpass filter may for this purpose be in the form of a highly reflective layer, which is reflective for a specific frequency range in which a predetermined mode of the resonator is located. Electromagnetic radiation at other frequencies is then absorbed or transmitted by the optical bandpass filter. Furthermore, it is possible for the mirror to comprise the bandpass filter. This means that the external mirror is itself then designed in such a way that it is highly reflective for a desired frequency range in which a predetermined mode of the resonator is located.

According to at least one embodiment of the surface-emitting semiconductor laser component, the bandpass filter has a bandwidth of more than 2 nm. This means that the bandpass filter passes a wavelength range of more than 2 nm. The surface-emitting semiconductor laser component described here in this case makes use, inter alia, of the discovery that a relatively broad pass band such as this is adequate for selection of a predetermined resonator mode, since the separation between the modes which are excited in the resonator is relatively great, because of the frequency-selective thermally conductive element. A bandpass filter with a broad pass band such as this can advantageously be produced easily and cost-effectively.

According to at least one embodiment, the surface-emitting semiconductor laser component can be pumped electrically. This means that electromagnetic radiation is produced by electrical excitation in the radiation-producing layer sequence of the semiconductor body. For this purpose, the semiconductor body has, for example, two contact layers, one of which can be arranged on the surface of the semiconductor body through which radiation passes. The contact layer then has a recess which, for example, is circular and through which the laser radiation circulating in the resonator can pass.

According to at least one embodiment, the surface-emitting semiconductor laser component is pumped optically. The pump source may be arranged externally for this purpose, that is to say remotely from the semiconductor body. Pump radiation from the pump beam source then preferably enters the radiation-producing layer sequence through the surface of the semiconductor body through which radiation passes. In this case, it is possible for pump radiation first of all to pass through the thermally conductive element. The pump beam source can in this case be provided, for example, by one or more diode lasers.

It is also possible for the pump radiation to be passed into the radiation-producing layer sequence in a direction transversely with respect to the emission direction of the surface-emitting semiconductor laser component. This means that the surface-emitting semiconductor laser component is pumped laterally. In this case, in particular, it is also possible for the pump beam source and the radiation-emitting layer sequence to be integrated monolithically on a common mount. This means that the pump beam source and the radiation-producing layer sequence are deposited epitaxially, for example at the same time or in a time sequence, successively on a common growth substrate.

Furthermore, an optical projection apparatus is specified, which has at least one surface-emitting semiconductor laser component, as is described in conjunction with the embodiments mentioned above. Furthermore, the projection apparatus may, for example, have drive electronics for driving the semiconductor laser component, and a housing in which the drive electronics and the semiconductor laser component are integrated. An optical projection apparatus such as this is particularly highly suitable for use in a multimedia projector or in a back-projection television. Because of its compact size, an optical projection apparatus such as this can even be used in small appliances, such as mobile telephones.

BRIEF DESCRIPTION OF THE DRAWINGS

FIG. 3 shows a schematic section illustration of the surface-emitting semiconductor laser component according to a second exemplary embodiment.

FIG. 4 shows a schematic section illustration of a projection apparatus according to one exemplary embodiment.

DETAILED DESCRIPTION OF THE DRAWINGS

Identical components or components with the same effect are each provided with the same reference symbols in the exemplary embodiments and figures. The described elements should not be regarded as being true to scale, and in fact individual elements may be illustrated in an excessively large form in order to assist understanding.

Figure 1:
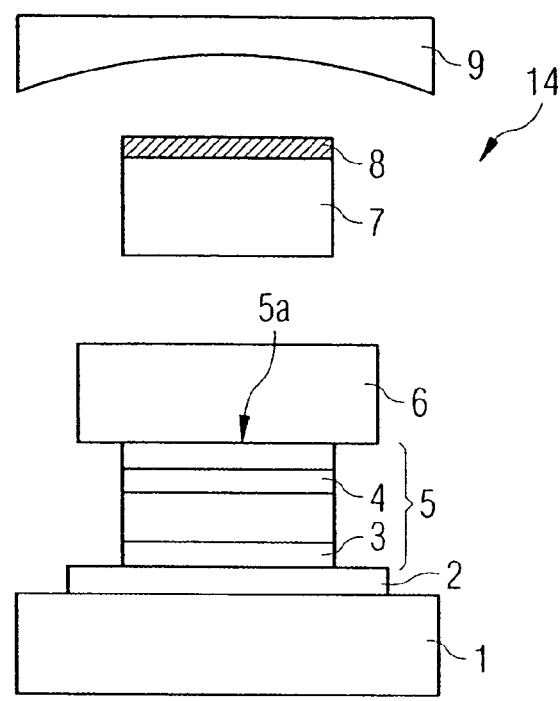
FIG. 1 shows a schematic section illustration of the surface-emitting semiconductor laser component according to a first exemplary embodiment.

FIG. 1 shows a schematic section illustration of the surface-emitting semiconductor laser component 14 described here, according to a first exemplary embodiment. The surface-emitting semiconductor laser component 14 has a semiconductor body 5. The semiconductor body 5 contains, inter alia, a reflective layer sequence 3 and a radiation-producing layer sequence 4.

The radiation-reflective layer sequence 3 is a reflective metal layer, a Bragg mirror or a combination of these reflective layers. The reflective layer sequence 3 in the exemplary embodiment illustrated in FIG. 1 is a Bragg mirror. The Bragg mirror has a plurality of semiconductor layer pairs with an advantageously high refractive-index difference. For example, one gallium-arsenide and one aluminum-gallium-arsenide $\lambda/4$ layer in each case form a semiconductor layer pair. The plurality of layer pairs in the Bragg mirror is indicated schematically by the layer 3 in FIG. 1. The Bragg mirror preferably comprises a sequence of 20-30 or more semiconductor layer pairs, thus resulting in the Bragg mirror having a particularly high reflectivity of 99.9% or more. The Bragg mirror is advantageously produced epitaxially together with the other semiconductor layers in the semiconductor body 5.

The radiation-producing layer sequence 4 preferably comprises an active area with a pn-junction, a single quantum-well structure or preferably a multiple quantum-well structure, which is suitable for radiation production. The expression quantum-well structure for the purposes of the application covers, in particular, any structure in which charge carriers have their energy state quantized by confinement. In particular, the expression quantum-well structure does not include any details relating to the dimensions of the quantization. It thus covers, inter alia, quantum troughs, quantum wires and quantum points, and any combination of these structures.

The radiation-emitting layer sequence 4 is preferably based on a III-V compound semiconductor material. This means that the radiation-emitting layer sequence 4 comprises at least one layer which is composed of a III-V compound semiconductor material. The radiation-emitting layer sequence 4 is preferably based on a nitride, phosphide or particularly preferably arsenide compound semiconductor.

In the present context, "based on nitride compound semiconductors" means that the radiation-emitting layer sequence 4 or at least one layer of it is composed of a nitride V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition in accordance with the above formula. In fact, it may have one or more dopants as well as additional components which do not significantly change the characteristic physical properties of the $Al_nGa_mIn_{1-n-m}N$ material. However, for the sake of simplicity, the above formula includes only the major components of the crystal lattice (Al, Ga, In, N), even if some of these can be replaced by small amounts of other substances.

In this context, "based on phosphide compound semiconductors" means that the radiation-emitting layer sequence 4 or at least one layer of it is preferably composed of $Al_nGa_mIn_{1-n-m}P$ where $0 \leq n \leq 1$, $0 \leq m \leq 1$ and $n+m \leq 1$. In this case, this material need not necessarily have a mathematically exact composition in accordance with the above formula. In fact, it may have one or more dopants as well as additional components which do not significantly change the physical properties of the material. However, for the sake of simplicity, the above formula includes only the major components of the crystal lattice (Al, Ga, In, P), even if some of these can be replaced by small amounts of other substances.

In this context, "based on arsenide compound semiconductors" means that the radiation-emitting layer sequence 4 or at least one layer of it is preferably composed of $Al_nGa_mIn_{1-n-m}As$ where $0 \leq n \leq 1$, $0 \leq m \leq 1$ and $n+m \leq 1$. In this case, this material need not necessarily have a mathematically exact composition in accordance with the above formula. In fact, it may have one or more dopants as well as additional components which do not significantly change the physical properties of the material. However, for the sake of simplicity, the above formula includes only the major components of the crystal lattice (Al, Ga, In, As), even if some of these can be replaced by small amounts of other substances.

These materials are distinguished by high internal quanta efficiencies which can be achieved in a simplified manner and are suitable for radiation from the ultraviolet (in particular nitride-based compound semiconductor material), through the visible (in particular phosphide-based compound semiconductor materials) to the infrared spectral range (in particular arsenide-based compound semiconductor materials).

The radiation-producing layer sequence 4 in the semiconductor body 5 is preferably based on an arsenide compound semiconductor material. Radiation in the infrared spectral range, in particular in the wavelength range between 800 nm and 1100 nm, can be produced particularly efficiently in this material system.

The thickness of the semiconductor body 5 is preferably between 5 μm and 8 μm, for example 7 μm.

The semiconductor body 5 is fitted to a mount 1, for example by being soldered to it. For this purpose, an IR solder layer 2, for example, may be located between the semiconductor body 5 and the mount 1, with a thickness of between 4 μm and 6 μm, preferably 5 μm. The mount 1 is preferably composed of a highly thermally conductive material such as a copper material or a copper compound material. The thickness of the mount 1 is preferably at least 2 mm, for example 3 mm.

Furthermore, the surface-emitting semiconductor laser component 14 has an external mirror 9. By way of example, the external mirror 9 has a concave curvature. Furthermore, an optically non-linear crystal 7 can be arranged in the resonator formed by the reflective layer sequence 3 and the external mirror 9 and, for example, is intended to double the frequency of the laser radiation circulating in the resonator.

In this case, the external mirror 9 is particularly highly reflective for the electromagnetic radiation produced in the radiation-emitting layer sequence 4, and is highly transmissive for the frequency-converted component of the radiation.

A thermally conductive element 6 is fitted to the surface 5a of the semiconductor body 5 through which radiation passes. The thermally conductive element 6 is, for example, an etalon, which contains or is composed of diamond, silicon carbide (SiC) or other highly thermally conductive transparent materials. The thermally conductive element which is fitted to the surface 5a through which radiation passes provides the advantage over heat dissipation from the rear face, for example by means of the reflective layer sequence 3, that the heat can be dissipated from the radiation-producing layer sequence 4 without a high thermal resistance. This makes it possible to reduce the thermal resistance from about 100 K/W to about 15 K/W—for an assumed pump beam diameter of 100 μm in the case of an external, optically pumped, surface-emitting semiconductor laser.

Because of the additional microcavity in the thermally conductive element 6, which in the case of a diamond thermally conductive element has a refractive index of about 2.4, the vertical laser emission wavelength is no longer defined by the semiconductor body-air junction, but essentially by the change in the refractive index of the thermally conductive element-air junction relative to the semiconductor-diamond junction. The change in the refractive index of the semiconductor-air junction is, for example, about 1.2, the change in the refractive index of a diamond-air junction is about 1.4, and the change in the refractive index between the semiconductor body 5 and the diamond thermally conductive element 6 is about 0.8. If the thermally conductive element 6 has a suitable layer thickness of about 30 to 60 µm, this microcavity leads to a spectrally narrowband single-frequency mode. The typical spectral laser emission with a full width at half maximum of about 4 nm can in this way be reduced to a full width at half maximum of about 0.4 nm (in this context, see also FIG. 2).

Figure 2:
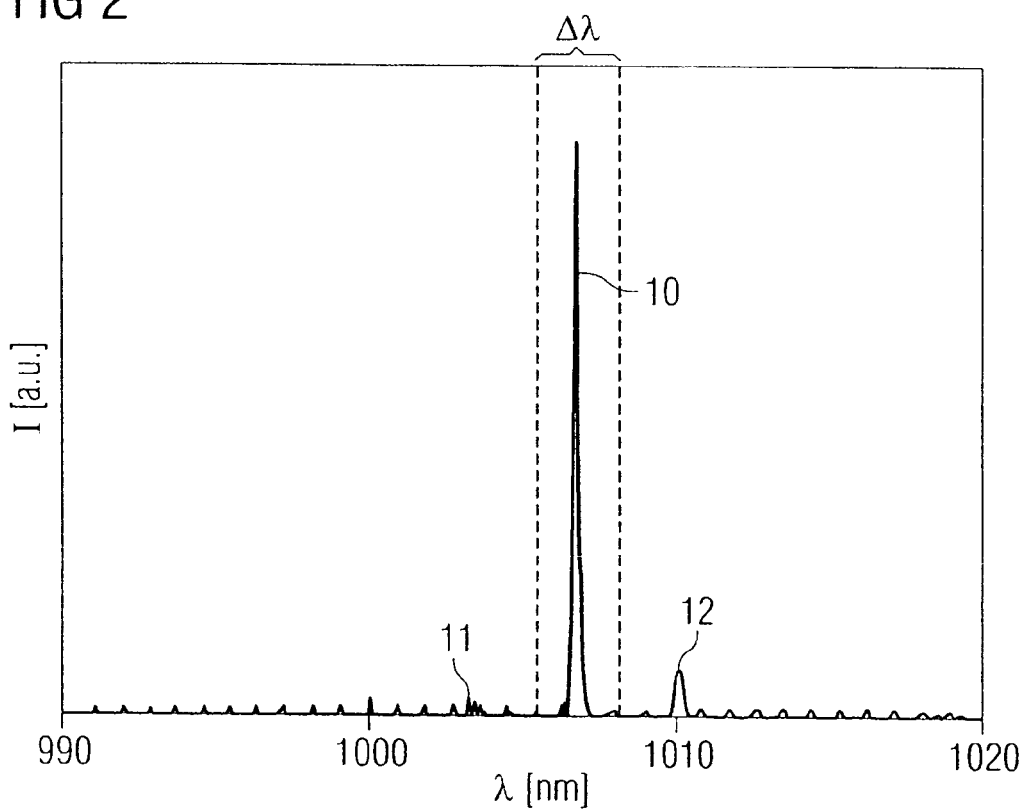
FIG. 2 shows a schematic illustration of the intensity distribution of different resonator modes.

As can be seen from the schematic illustration of the intensity distribution for the transversal fundamental mode 10 and for two higher modes 11, 12 in FIG. 2, a plurality of longitudinal modes 10, 11, 12 are excited in the laser resonator, and their separation is inversely proportional to the optical thickness of the thermally conductive element 6.

Owing to the narrow spectral line width with a full width at half maximum of at most 0.4 nm of the vertical laser emission, the frequency can be doubled efficiently in the non-linear crystal 7 which, by way of example, has a spectral acceptance bandwidth of about 1 nm. The escape of the vertical laser emission to other longitudinal modes 11, 12 can be suppressed by an optical bandpass filter 8, which can be applied as an antireflective coating to the optically non-linear crystal 7.

Owing to the relatively large spectral separation between the longitudinal modes 11, 10, 12 (in this context see FIG. 2), which is made possible by the frequency-selective, resonator-internal thermally conductive element 7, it is possible to use a relatively broadband bandpass filter with a spectral bandwidth $\Delta\lambda$. The spectral bandwidth $\Delta\lambda$ of the bandpass filter must in this case be less than the separation between, for example, the fundamental mode 10 and adjacent longitudinal modes 11, 12. A spectrally relatively broad bandpass filter such as this may, for example, be in the form of a dielectric coating. By way of example, in the exemplary embodiment in FIG. 1, it is sufficient for the bandpass filter to have a bandwidth $\Delta\lambda$ of at most 6 nm.

FIG. 3 shows a schematic section illustration of the surface-emitting semiconductor laser component 14 as described here, according to a second exemplary embodiment. In this exemplary embodiment, the optical bandpass filter 8 is provided as a highly reflective coating on the external mirror 9. For this purpose, by way of example, the bandpass filter 8 has a reflectivity of more than 99.9% for a narrow wavelength range $\Delta\lambda$ around the frequency of the longitudinal fundamental mode $TEM_{00}$.

FIG. 4 shows a schematic section illustration of a projection apparatus according to one exemplary embodiment.

The optical projection apparatus has at least one surface-emitting semiconductor laser component, as has been described in conjunction with FIGS. 1 and 2. In addition to one of the semiconductor lasers 14 as described above, the projection apparatus may also have, for example, drive electronics 20 for driving the semiconductor laser, and a housing 21 in which the drive electronics 20 and the semiconductor laser 14 are integrated. In addition, the semiconductor laser 14 has a pump beam source 22 which is suitable for optically pumping the semiconductor laser component 14.

The disclosed optical projection apparatus is particularly readily suitable for use in a multimedia projector or in a back-projection television. Because of its compact size, an optical projection apparatus such as this can also be used in small appliances, such as mobile telephones.

The invention is not restricted by the description based on the exemplary embodiments. In fact, the invention covers any new feature as well as any combination of features, in particular including any combination of features in the patent claims, even if this feature or this combination itself is not explicitly stated in the patent claims or exemplary embodiments.

I claim:

1. A surface-emitting semiconductor laser component, comprising:
   a resonator;
   a semiconductor body which comprises a layer sequence which is intended for radiation production;
   a transparent, frequency-selective thermally conductive element in thermal contact with a surface of the semiconductor body through which radiation passes; and
   an optical bandpass filter which is suitable for suppression of predeterminable resonator modes;
   wherein the thermally conductive element is an etalon and has a thickness between 30 µm and 60 µm, and
   wherein the thermally conductive element forms a microcavity configured such that the radiation production has a spectrally narrow band single-frequency mode.

2. The surface-emitting semiconductor laser component as claimed in claim 1, in which the thermally conductive element contains one of the following materials: diamond, silicon carbide.

3. The surface-emitting semiconductor laser component as claimed in claim 1, in which at least one optically non-linear crystal is arranged in the resonator.

4. The surface-emitting semiconductor laser component as claimed in claim 1, in which the bandpass filter suppresses higher resonator modes than the fundamental mode.

5. The surface-emitting semiconductor laser component as claimed in claim 1, in which the bandpass filter is in the form of an antireflective coating on one surface of the non-linear optical crystal.

6. The surface-emitting semiconductor laser component as claimed in claim 1, in which the bandpass filter is in the form of a reflective layer.

7. The surface-emitting semiconductor laser component as claimed in claim 1, in which a resonator mirror comprises the bandpass filter.

8. The surface-emitting semiconductor laser component as claimed in claim 1, in which the bandpass filter has a bandwidth of more than 2 nanometers.

9. The surface-emitting semiconductor laser component as claimed in claim 1, in which the semiconductor laser component can be pumped electrically.

10. The surface-emitting semiconductor laser component as claimed in claim 1, in which an optical pump beam source is arranged remotely from the semiconductor body.

11. The surface-emitting semiconductor laser component as claimed in claim 1, in which the optical pump source is monolithically integrated on a common mount with the semiconductor body which comprises the radiation-emitting layer sequence.

12. An optical projection appliance having a semiconductor laser component as claimed in claim 1, and having drive electronics for the semiconductor laser component.

13. The surface-emitting semiconductor laser component as claimed in claim 1, wherein the thermally conductive element is arranged within the resonator.

14. The surface-emitting semiconductor laser component as claimed in claim 1, wherein the thermally-conductive element has a greater extension than the surface of the semiconductor body through which radiation passes in a direction parallel to said surface.

15. The surface-emitting semiconductor laser component as claimed in claim 1, wherein a change in a refractive index between the semiconductor body and the thermally conductive element is smaller than a change in a refractive index between the thermally conductive element and air surrounding the surface-emitting semiconductor laser component.

16. A surface-emitting semiconductor laser component, comprising:
   a resonator;
   a semiconductor body which comprises a layer sequence which is intended for radiation production;
   a transparent, frequency-selective thermally conductive element in thermal contact with a surface of the semiconductor body through which radiation passes; and
   an optical bandpass filter which is suitable for suppression of predeterminable resonator modes;
   wherein the thermally conductive element is an etalon and has a thickness between 30 μm and 60 μm,
   wherein the thermally conductive element forms a microcavity configured such that the radiation production has a spectrally narrow band single-frequency mode, and
   wherein the thermally-conductive element has a greater extension than the surface of the semiconductor body through which radiation passes in a direction parallel to said surface.

* * * * *